United States Patent
Nagao (10) Patent No.: US 11,152,589 B2
(45) Date of Patent: Oct. 19, 2021

(54) ORGANIC EL DEVICE, ORGANIC EL LIGHTING PANEL, ORGANIC EL LIGHTING APPARATUS, AND ORGANIC EL DISPLAY

(71) Applicant: NEC LIGHTING, LTD., Tokyo (JP)

(72) Inventor: Kazuhiro Nagao, Tokyo (JP)

(73) Assignee: HotaluX, Ltd., Tokyo (JP)

( * ) Notice: Subject to any disclaimer, the term of this patent is extended or adjusted under 35 U.S.C. 154(b) by 897 days.

(21) Appl. No.: 15/932,306

(22) PCT Filed: Jul. 20, 2016

(86) PCT No.: PCT/JP2016/071314
§ 371 (c)(1),
(2) Date: Feb. 16, 2018

(87) PCT Pub. No.: WO2017/029930
PCT Pub. Date: Feb. 23, 2017

(65) Prior Publication Data
US 2020/0295296 A1    Sep. 17, 2020

(30) Foreign Application Priority Data
Aug. 18, 2015  (JP) ............................. JP2015-160992

(51) Int. Cl.
*H01L 29/08*  (2006.01)
*H01L 51/52*  (2006.01)
*H01L 51/00*  (2006.01)

(52) U.S. Cl.
CPC ...... *H01L 51/5246* (2013.01); *H01L 51/0097* (2013.01); *H01L 51/5259* (2013.01);
(Continued)

(58) Field of Classification Search
None
See application file for complete search history.

(56) References Cited

U.S. PATENT DOCUMENTS 9,847,505 B2 * 12/2017 Chida ................ H01L 51/5246
2007/0290609 A1 * 12/2007 Ishii ..................... H01L 51/524
313/504
(Continued)

FOREIGN PATENT DOCUMENTS

JP    2006-252988 A    9/2006
JP    2006-253097 A    9/2006
(Continued)

OTHER PUBLICATIONS

Communication dated Apr. 28, 2020, from the Japanese Patent Office in Application No. 2017-535301.
(Continued)

*Primary Examiner* — Hung K Vu
(74) *Attorney, Agent, or Firm* — Sughrue Mion, PLLC (57) ABSTRACT

An organic EL device (1) includes: a first substrate (11); a second substrate (12); one or more organic EL elements; and a sealing layer (14). One surface of the first substrate (11) is a mounting surface on which the one or more organic EL elements are disposed. The first substrate (11) and the second substrate (12) are laminated in such a manner that the mounting surface of the first substrate (11) and one surface of the second substrate (12) face each other with the sealing layer (14) interposed therebetween. The second substrate (12) has at least one recessed part (16) and at least one protruding part (15) in a region inside the sealing layer (14) on the surface of the second substrate (12) facing the first substrate (11), and the moisture absorbent (19) is disposed in the recessed part (16).

16 Claims, 5 Drawing Sheets

(52) U.S. Cl.
CPC ............... *H01L 2251/5338* (2013.01); *H01L 2251/5361* (2013.01)

(56) References Cited

U.S. PATENT DOCUMENTS

| | | | | |
|---|---|---|---|---|
| 2011/0052857 A1* | 3/2011 | Suzuki | .................. | H05B 33/04 |
| | | | | 428/76 |
| 2011/0080089 A1* | 4/2011 | Hara | .................. | H01L 51/5237 |
| | | | | 313/504 |
| 2012/0256204 A1* | 10/2012 | Yoshizumi | .......... | H01L 27/3246 |
| | | | | 257/88 |
| 2012/0292652 A1* | 11/2012 | Yamae | ................ | H01L 51/5275 |
| | | | | 257/98 |
| 2015/0255740 A1* | 9/2015 | Nakada | ............... | H01L 51/5237 |
| | | | | 257/40 |

FOREIGN PATENT DOCUMENTS

| | | |
|---|---|---|
| JP | 2007-335365 A | 12/2007 |
| JP | 2011-081944 A | 4/2011 |
| JP | 2011-181304 A | 9/2011 |
| JP | 2012-227137 A | 11/2012 |
| WO | 2009/139292 A1 | 11/2009 |

OTHER PUBLICATIONS

International Search Report for PCT Application No. PCT/JP2016/071314, dated Oct. 25, 2016.

* cited by examiner

ORGANIC EL DEVICE, ORGANIC EL LIGHTING PANEL, ORGANIC EL LIGHTING APPARATUS, AND ORGANIC EL DISPLAY

This application is a National Stage Entry of PCT/JP2016/071314 filed on Jul. 20, 2016, which claims priority from Japanese Patent Application 2015-160992 filed on Aug. 18, 2015, the contents of all of which are incorporated herein by reference, in their entirety.

TECHNICAL FIELD

The present invention relates to an organic EL device, an organic EL lighting panel, an organic EL lighting apparatus, and an organic EL display.

BACKGROUND ART

An organic electro-luminescence (EL) device generally is configured as follows. The EL device includes one or more organic EL elements (each including an organic EL layer and a pair of electrodes), a substrate on which the organic EL element(s) is laminated, a sealing substrate, a sealing layer, and a filler. The sealing layer is disposed along outer edges of facing surfaces of the substrate and the sealing substrate, and the substrate and the sealing substrate are laminated with the sealing layer interposed therebetween. A gap between the substrate and the sealing substrate is filled with the filler.

In the organic EL device configured as above, the organic EL element(s) is in a region surrounded by the substrate, the sealing substrate, and the sealing layer, and the gap formed in the region is filled with the filler. With this configuration, the organic EL element(s) is protected from moisture in the air. However, some of the moisture in the air may pass through the sealing layer to infiltrate into the region. Thus, the organic EL device with the above-described configuration has a problem in that the moisture that has infiltrated into the region accelerates the deterioration of the organic EL element(s), thereby lowering the reliability of the organic EL device.

In order to solve this problem, there have been proposed an organic EL device in which the filler contains a moisture absorbent and an organic EL device in which a moisture absorbent is disposed on the sealing substrate (Patent Document 1).

CITATION LIST

Patent Document(s)

Patent Document 1: WO 2009/139292 A1

BRIEF SUMMARY OF THE INVENTION

Problem to be Solved by the Invention

However, the organic EL devices disclosed in Patent Document 1 each have a problem in that the material of the filler has to be selected from a narrow range. Also, the organic EL devices disclosed in Patent Document 1 each have another problem in that, when the organic EL device is bent, the filler may be present unevenly in the gap. As a result, the organic EL element(s) cannot be protected sufficiently, so that the organic EL element(s) may be damaged.

With the foregoing in mind, it is an object of the present invention to provide an organic EL device that allows a wide choice for the material of a filler and also can reduce the possibility that an organic EL element(s) may be damaged when the organic EL device is bent.

Means for Solving Problem

In order to achieve the above object, the present invention provides an organic EL device including: a first substrate; a second substrate; one or more organic EL elements; and a sealing layer. Each of the one or more organic EL elements includes an organic EL layer and a pair of electrodes. One surface of the first substrate is a mounting surface on which the one or more organic EL elements are disposed. The first substrate and the second substrate are laminated in such a manner that the mounting surface of the first substrate and one surface of the second substrate face each other with the sealing layer interposed therebetween. The sealing layer seals a gap between the first substrate and the second substrate along an entire periphery of a region facing the second substrate on the mounting surface of the first substrate and an entire periphery of a region facing the first substrate on the surface of the second substrate facing the first substrate. The second substrate has at least one recessed part and at least one protruding part in a region inside the sealing layer on the surface of the second substrate facing the first substrate, and the moisture absorbent is disposed in the recessed part.

Effects of the Invention

According to the present invention, it is possible to provide an organic EL device that allows a wide choice for the material of a filler and also can reduce the possibility that an organic EL element(s) may be damaged when the organic EL device is bent.

MODE FOR CARRYING OUT THE INVENTION

In the present invention, "a wide choice is allowed for the material of a filler" also encompasses embodiments in which a filler is not used.

The organic EL device, the organic EL lighting panel, the organic EL lighting apparatus, and the organic EL display according to the present invention will be described specifically below with reference to the accompanying drawings. It is to be noted, however, that the present invention is by no means limited by the following description. In FIGS. 1 to 6 to be described below, the same components are given the same reference numerals, and duplicate explanations thereof may be omitted. Also, in the drawings, the structure of each component may be shown in an simplified form as appropriate for the sake of convenience in illustration, and also, each component may be shown schematically with a dimension ratio and the like that are different from the actual dimension ratio and the like.

First Embodiment

Figure 1A:
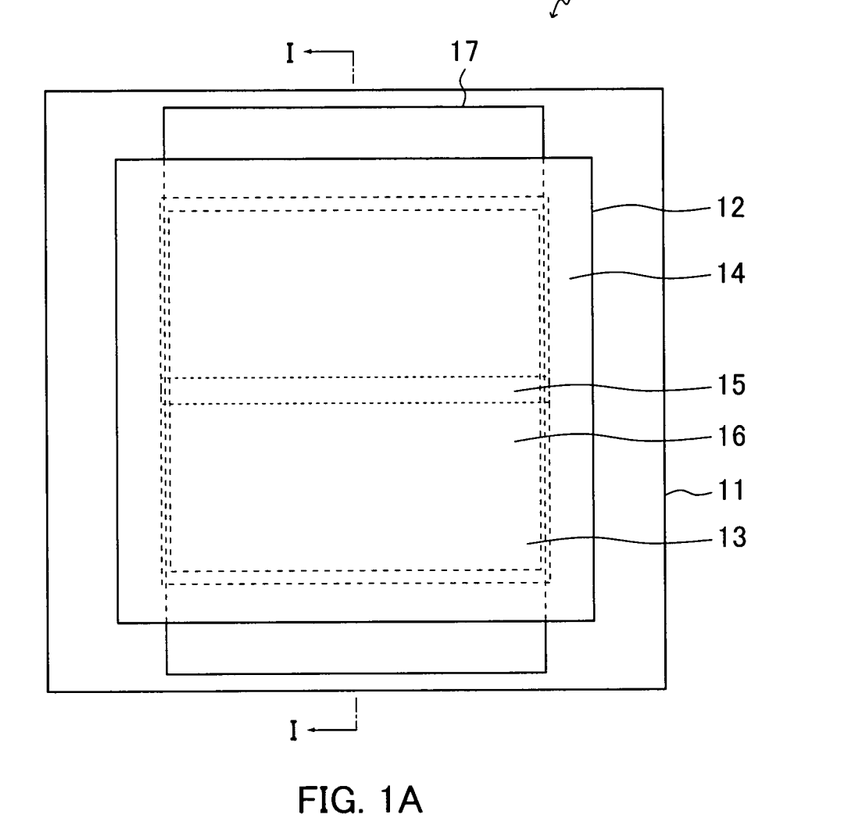
FIG. 1A is a plan view showing an example of the configuration of an organic EL device of a first embodiment.
Figure 1B:
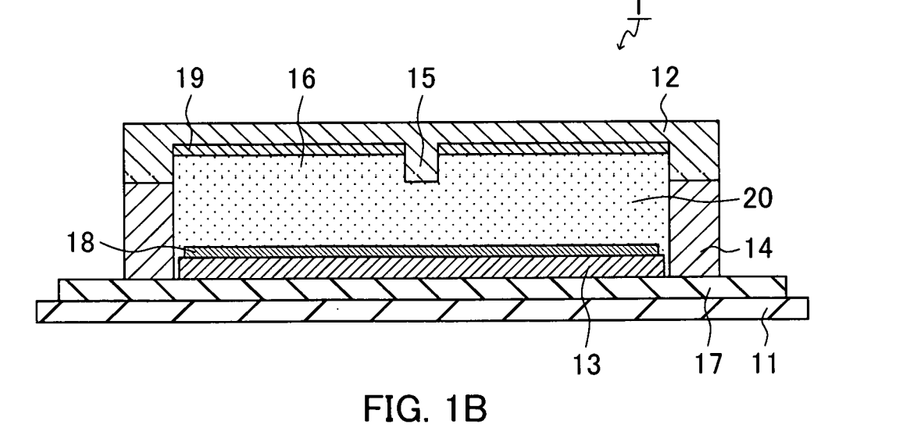
FIG. 1B is a sectional view of the organic EL device shown in FIG. 1A, taken in the arrow direction of line I-I in FIG. 1A.

The present embodiment is directed to an example of an organic EL device configured so that a second substrate has, on one surface thereof (the surface facing the first substrate), one protruding part and two recessed parts in a region inside a sealing layer. FIGS. 1A and 1B shows the organic EL device of the present embodiment. FIG. 1A is a plan view showing an example of the configuration of the organic EL device of the present embodiment, and FIG. 1B is a sectional view of the organic EL device shown in FIG. 1A, taken in the arrow direction of line I-I in FIG. 1A. As shown in FIGS. 1A and 1B, the organic EL device 1 of the present embodiment includes a first substrate 11, a second substrate 12, an organic EL element, and a sealing layer 14. The organic EL element includes an organic EL layer 13 and a pair of electrodes (an anode 17 and a cathode 18). One surface of the first substrate 11 (the upper surface in FIG. 1B) is a mounting surface on which the organic EL element is disposed. The first substrate 11 and the second substrate 12 are laminated in such a manner that the mounting surface of the first substrate 11 faces one surface of the second substrate 12 (the lower surface in FIG. 1B) with the sealing layer 14 interposed therebetween. The sealing layer 14 seals a gap between the first substrate 11 and the second substrate 12 along an entire periphery of a region facing the second substrate 12 on the mounting surface of the first substrate 11 and an entire periphery of a region facing the first substrate 11 on the surface of the second substrate 12 facing the first substrate 11. The second substrate 12 has one protruding part 15 and two recessed parts 16 in a region inside the sealing layer 14 on the surface thereof facing the first substrate 11. A moisture absorbent 19 is disposed in each of the two recessed parts 16. While the organic EL device 1 shown in FIGS. 1A and 1B is in a square shape, the shape of the organic EL device of the present invention is not limited thereto. Examples of the shape of the organic EL device of the present invention include: polygonal shapes other than the square shape, such as parallelogram shapes (including a rectangular shape and a rhombic shape) other than the square shape, a trapezoidal shape, a pentagonal shape, and a hexagonal shape; a circular shape; an oval shape; and shapes similar to these shapes (e.g., a substantially square shape and the like).

In the organic EL device 1 shown in FIG. 1, a gap present between the first substrate 11 and the second substrate 12 and surrounded by the sealing layer 14 is filled with a filler 20. In the organic EL device 1 of the present embodiment, the filler 20 is an optional component. While the organic EL device 1 of the present embodiment preferably includes the filler 20, it is not necessary that the organic EL device 1 includes the filler 20.

The organic EL device 1 of the present embodiment preferably is bendable, i.e., preferably is the so-called flexible organic EL device. To this end, it is preferable that the first substrate 11 and the second substrate 12 are flexible substrates.

It is preferable that the first substrate 11 transmits light emitted from the organic EL layer 13 at a high transmittance. The first substrate 11 has a total light transmittance of at least 80% or at least 84%, for example. Examples of the material of the first substrate 11 include resins including: polyesters such as polyethylene naphthalate and polyethylene terephthalate; acrylic resins such as polymethyl methacrylate, polyethyl methacrylate, polymethyl acrylate, and polyethyl acrylate; polyether sulfone; and polycarbonates, and glass. When the first substrate 11 is a film made of a resin, the film may have a single layer structure, or may be a laminate of two or more resin films. The thickness of the resin film (when the resin film is the laminate, the total thickness of the respective layers) is in the range from 50 to 200 μm, for example. When the material of the first substrate 11 is glass, the thickness of the first substrate 11 is, for example, in the range from 50 to 100 μm from the viewpoint of flexibility. When moisture permeation cannot be inhibited sufficiently by the first substrate 11 alone, it is preferable to form a barrier film for inhibiting the moisture permeation on the mounting surface of the first substrate 11. The size (the length and the width) of the first substrate 11 is not particularly limited, and can be set as appropriate depending on a desired size of the organic EL device 1, for example.

The material of the second substrate 12 may be a metal, for example. Examples of the metal include stainless steel and aluminum. It is to be noted, however, that the material of the second substrate 12 is not limited to the metal, and examples thereof may include the resins and the like given above as examples of the material of the first substrate 11. In the case where the material of the second substrate 12 is the metal, the possibility that undulations may be formed when the organic EL device 1 is bent can be reduced. As a result, reflection of light caused by undulations can be inhibited more effectively. Further, in the case where the first substrate 11 and the second substrate 12 are formed using the same resin, the degree of bending of the first substrate 11 is substantially the same as that of the second substrate 12 when the organic EL device 1 is bent. This allows the organic EL device 1 to be bent more uniformly, so that it is possible to more suitably prevent the surface of the second substrate 12 facing the first substrate 11 from coming into contact with the organic EL element when the organic EL device 1 is bent. As a result, the possibility that the organic EL element may be damaged can be reduced more suitably. The thickness of the second substrate 12 is in the range from 50 to 200 μm, for example.

As described above, the surface of the second substrate 12 facing the first substrate 11 has one protruding part 15 and two recessed parts 16. As shown in FIG. 1A, the protruding part 15 is in the shape of a rectangular parallelepiped connecting an upper inner periphery on the left side and an upper inner periphery on the right side of the sealing layer 14 in a square tubular shape. The width of the protruding part 15 is in the range from 5 to 300 μm or 8 to 100 μm, for example. The depth of the recessed parts 16 is in the range from 5 to 150 μm or 10 to 50 μm, for example.

The organic EL element is a laminate in which the anode 17, the organic EL layer 13, and the cathode 18 are laminated in this order.

It is preferable that the anode 17 transmits light emitted from the organic EL layer 13 at a high transmittance. The anode 17 has a total light transmittance of at least 85%, for example. Examples of the material of the anode 17 include indium tin oxide and indium zinc oxide. While the anode 17 in the organic EL device 1 shown in FIGS. 1A and 1B is in a rectangular shape, the organic EL device of the present embodiment is not limited thereto. The anode 17 may have any shape as long as voltage application to the organic EL layer 13 is possible. The thickness of the anode 17 is not particularly limited, and is in the range from 50 to 300 nm, for example.

As the organic EL layer 13, a conventionally known and commonly used organic EL layer may be used. The organic EL layer 13 has, for example, a multilayer structure including, in sequence, a hole injection layer, a hole transport layer, a light emission layer containing an organic EL material, an electron transport layer, and an electron injection layer. The thickness of each layer included in the organic EL layer 13 is not particularly limited, and is in the range from 1 to 200 nm, for example. The thickness of the organic EL layer 13 as a whole is not particularly limited, and is in the range from 100 to 1000 nm, for example.

The material of the cathode 18 is aluminum or silver, for example. The thickness of the cathode 18 is not particularly limited, and is in the range from 50 to 300 nm, for example.

Examples of the material of the sealing layer 14 include ultraviolet-curable adhesives and thermosetting adhesives, such as epoxy resins and acrylic resins. The sealing layer 14 is formed so that the thickness thereof is slightly greater than the total thickness of the organic EL layer 13 and the cathode 18. The thickness of the sealing layer 14 is in the range from 1 to 100 μm, for example.

Examples of the moisture absorbent 19 include: substances that physically adsorb moisture, such as zeolite, silica gel, and activated carbon; substances that react with moisture to cause chemical change, such as alkali metal oxides, Alkaline-earth metal oxides (e.g., calcium oxide, barium oxide, and strontium oxide), magnesium oxide, aluminum oxide, and phosphorus oxides (e.g., phosphorus pentoxide); and deliquescent substances such as calcium chloride and magnesium chloride. The amount of the moisture absorbent 19 is not particularly limited as long as it is sufficient to absorb moisture, and can be determined as appropriate depending on the size and the like of the organic EL device 1, for example.

The filler 20 may be an inert gas, for example. By using a substance with fluidity, such as silicone, as the filler 20, it is possible to more suitably prevent the surface of the second substrate 12 facing the first substrate 11 from coming into contact with the organic EL element when the organic EL device 1 is bent. As a result, the possibility that the organic EL element may be damaged can be reduced more suitably. The moisture absorbent 19 may be mixed in the silicone or the like, in addition to being disposed in the recessed parts 16 on the surface of the second substrate 12 facing the first substrate 11.

Next, a method for producing the organic EL device 1 of the present embodiment will be described with reference to an illustrative example. It is to be noted, however, that this production method is merely illustrative, and the organic EL device 1 of the present embodiment may be produced by any method. Preferably, the organic EL device 1 of the present embodiment is produced in an inert gas atmosphere in order to reduce the possibility that the organic EL element may be in contact with moisture.

First, a second substrate 12 is provided. The method for forming the second substrate 12 is not particularly limited, and may be any method. For example, the second substrate 12 can be formed by forming two recessed parts 16 on a flat thin film made of the above-described material of the second substrate 12 (e.g., a metal foil or a resin film) by etching. The second substrate 12 also can be formed by stamping carried out by pressing the thin film against a die, for example.

Next, the anode 17 is formed on the mounting surface of the first substrate 11. The anode 17 can be formed by, for example, forming a film of the above-described material of the anode 17 according to a conventionally known method such as sputtering or chemical vapor deposition (CVD) with the use of a shadow mask. The anode 17 also can be formed by uniformly applying the above-described material of the anode 17 on the mounting surface of the first substrate 11 to form a film and patterning the thus-formed film into a desired shape by photolithography.

Next, the organic EL layer 13 is formed on the anode 17. The organic EL layer 13 can be formed using a conventionally known material by a conventionally known method, such as vacuum deposition by resistance heating, molecular beam epitaxy (MBE), or laser ablation, with the use of a shadow mask, for example. When the organic EL layer 13 is formed using a polymeric material, the organic EL layer 13 can be formed on the anode 17 by applying the polymeric material in the form of liquid by printing such as ink-jet printing. It is also possible to apply the polymeric material in the form of a photosensitive coating solution by spin coating or slit coating and to form the organic EL layer 13 on the anode 17 by photolithography.

Next, the cathode 18 is formed on the organic EL layer 13. The cathode 18 can be formed using the above-described material of the cathode 18 by a conventionally known method such as vacuum deposition or sputtering, for example.

Next, the moisture absorbent 19 is disposed in the two recessed parts 16 on the surface of the second substrate 12 facing the first substrate 11. The method for disposing the moisture absorbent 19 is not particularly limited, and may be any method. For example, the moisture absorbent 19 can be disposed by applying an adhesive uniformly onto each of the two recessed parts 16 and then attaching the moisture absorbent 19 to the surface of the adhesive.

Next, the sealing layer 14 is formed on the anode 17, and a gap present between the first substrate 11 and the second substrate 12 and is surrounded by the sealing layer 14 is filled with the filler 20. Thereafter, the second substrate 12 is bonded to the upper surface of the sealing layer 14 with an adhesive or by fusion. Through the above-described process, the organic EL device 1 of the present embodiment can be obtained. When the organic EL device 1 of the present embodiment is produced in an inert gas atmosphere and the inert gas is used as the filler 20, the gap is already filled with the inert gas, so that it is not necessary to perform the above-described step of filling the gap with the filler 20.

In the organic EL device 1 of the present embodiment, the moisture absorbent 19 is disposed in the recessed parts 16 on the surface of the second substrate 12 facing the first substrate 11. With this configuration, moisture in the region surrounded by the first substrate 11, the second substrate 12, and the sealing layer 14 can be removed to inhibit the deterioration of the organic EL element. The filler 20 is a component to be in contact with the organic EL element.

Thus, a substance with fluidity, such as the above-described inert gas or silicone, preferably is used as the filler 20 so as to reduce the possibility that the organic EL element may be damaged. In contrast, the moisture absorbent 19 disposed in the recessed parts 16 on the surface of the second substrate 12 facing the first substrate 11 is not a component to be in contact with the organic EL element. Thus, the moisture absorbent 19 is not limited to a substance with fluidity, and may be a solid substance or the like. Also, in the organic EL device 1 of the present embodiment, the moisture absorbent 19 is disposed in the recessed parts 16. With the configuration, it is not necessary that, for example, the filler 20 has a moisture absorption function, so that a wider choice is allowed for the material of the filler 20.

Figure 6:
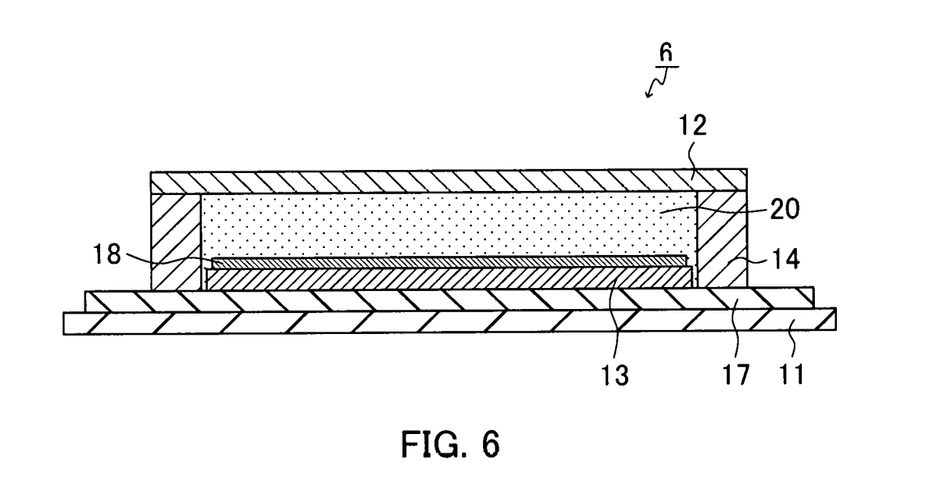
FIG. 6 is a sectional view showing an example of an organic EL device in which a second substrate is a flat substrate.

Further, in the organic EL device 1 of the present embodiment, the surface of the second substrate 12 facing the first substrate 11 has the protruding part 15. With this configuration, the organic EL device 1 can restrict the movement of the filler 20 when the organic EL device 1 is bent more effectively than the organic EL device 6 having the flat second substrate 12 as shown in FIG. 6, so that it is possible to inhibit uneven distribution of the filler 20. Accordingly, in the organic EL device 1, the surface of the second substrate 12 facing the first substrate 11 can be prevented from coming into contact with the organic EL element when the organic EL device 1 is bent more suitably than in the organic EL device 6 shown in FIG. 6. As a result, the possibility that the organic EL element may be damaged can be reduced more suitably.

Figure 5:
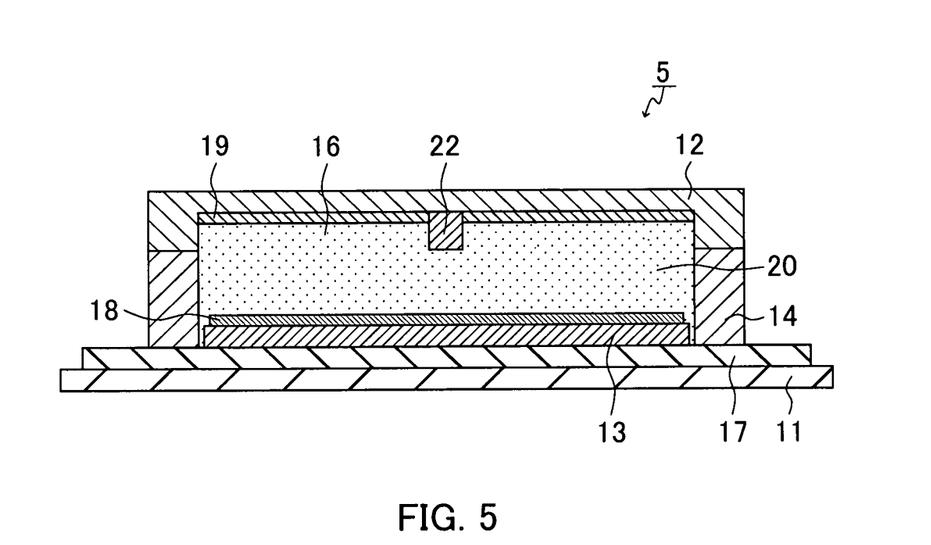
FIG. 5 is a sectional view showing an example of an organic EL device configured so that recessed parts and a protruding part are formed on a surface of a second substrate facing a first substrate using a separate member.

One possible way to provide recessed parts and a protruding part on the surface of the second substrate 12 facing the first substrate 11 is to use a separate member 22 as shown in FIG. 5. In contrast, in the organic EL device 1 of the present embodiment, the recessed parts and the protruding part are provided using the second substrate 12 alone. The organic EL device 1 of the present embodiment in which the recessed parts and the protruding part are formed using the same material is advantageous in that, for example, a strength can be imparted to the organic EL device 1 easily, the organic EL device 1 can be processes easily, and the organic EL device 1 can be bent uniformly. Further, according to the organic EL device 1 of the present embodiment, it is not necessary to use an adhesive for bonding the separate member 22 onto the surface of the second substrate 12 facing the first substrate 11, so that it is also possible to inhibit the deterioration of the organic EL element caused by residual solvent and moisture derived from the adhesive.

Moreover, in the organic EL device 1 of the present embodiment, the second substrate 12 has the recessed parts 16 on the surface thereof facing the first substrate 11. With this configuration, the distance from the end of the surface of the second substrate 12 facing the first substrate 11 inside the sealing layer 14 to the organic EL element is longer than that in the organic EL device 6 having the flat second substrate 12 as shown in FIG. 6 by the depth of the recessed parts 16. Accordingly, in the organic EL device 1, the surface of the second substrate 12 facing the first substrate 11 can be prevented from coming into contact with the organic EL element when the organic EL device 1 is bent more suitably than in the organic EL device 6 shown in FIG. 6. As a result, the possibility that the organic EL element may be damaged can be reduced more suitably.

The organic EL device 1 of the present embodiment can be used in a wide range of applications, such as, for example, an organic EL lighting panel, an organic EL lighting apparatus, and an organic EL display, as described below.

Second Embodiment

Figure 2:
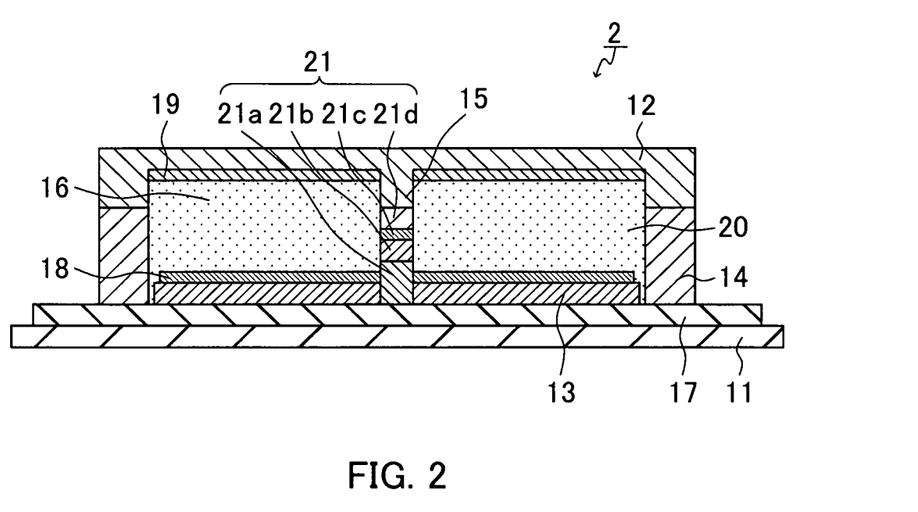
FIG. 2 is a sectional view showing an example of the configuration of an organic EL device of a second embodiment.

The present embodiment is directed to an example of an organic EL device configured so that it includes a supporting layer, and the supporting layer is disposed so as to connect part of a region without organic EL elements on a mounting surface of a first substrate and a protruding part on a surface of the second substrate facing the first substrate. FIG. 2 is a sectional view showing an example of the configuration of the organic EL device of the present embodiment. As shown in FIG. 2, the organic EL device 2 of the present embodiment has the same configuration as the organic EL device 1 of the first embodiment, except that it includes a supporting layer 21, and part of the region without organic EL elements is formed by the supporting layer 21. In this example, the supporting layer 21 is not disposed in a region between the periphery of organic EL layers 13 and a sealing layer 14, which is other part of the region without the organic EL elements. It is to be noted, however, that the present example merely shows an example of the configuration of the organic EL device of the present embodiment, and the organic EL device of the present embodiment may be configured so that supporting layers are further provided in the region between the periphery of the organic EL layers and the sealing layer.

As shown in FIG. 2, the supporting layer 21 is a laminate including a lower supporting layer 21a, a first intermediate supporting layer 21b, a second intermediate supporting layer 21c, and an upper supporting layer 21d. One surface of the lower supporting layer 21a (the lower surface in FIG. 2) is in contact with the anode 17, and the other surface of the lower supporting layer 21a (the upper surface in FIG. 2) is in contact with one surface of the first intermediate supporting layer 21b (the lower surface in FIG. 2). The other surface of the first intermediate supporting layer 21b (the upper surface in FIG. 2) is in contact with one surface of the second intermediate supporting layer 21c (the lower surface in FIG. 2). The other surface of the second intermediate supporting layer 21c (the upper surface in FIG. 2) is in contact with one surface of the upper supporting layer 21d (the lower surface in FIG. 2), and the other surface of the upper supporting layer 21d (the upper surface in FIG. 2) is in contact with a protruding part 15 on the surface of the second substrate 12 facing the first substrate 11. With this configuration, the supporting layer 21 connects part of the region without the organic EL elements on the mounting surface of the first substrate 11 and the protruding part 15 on the surface of the second substrate 12 facing the first substrate 11.

In the organic EL device 2 of the present embodiment, the anode 17 is formed on the first substrate 11. The lower supporting layer 21a is formed on the anode 17. The organic EL layers 13 and the first intermediate supporting layer 21b are formed on the anode 17 and on the lower supporting layer 21a, respectively, using the same material. Cathodes 18 and the second intermediate supporting layer 21c are formed on the organic EL layers 13 and on the first intermediate supporting layer 21b, respectively, using the same material. As a result, a region where the anode 17, the organic EL layers 13, and the cathodes 18 are laminated serves as the organic EL elements, and a region where the lower supporting layer 21a is interposed between the anode 17 and the first intermediate supporting layer 21b, i.e., a region where the supporting layer 21 is to be disposed, forms part of the region without the organic EL elements.

The supporting layer 21 is in the shape of a rectangular parallelepiped, similarly to the protruding part 15 on the surface of the second substrate 12 facing the first substrate 11. The supporting layer 21 has the same width as the protruding part 15.

The lower supporting layer 21a preferably is an insulating layer. The material of the lower supporting layer 21a is, for example, a resin or an inorganic compound, and examples of the material of the lower supporting layer 21a include those described above as examples of the material of the first substrate 11. The thickness of the lower supporting layer 21a is not particularly limited, and is, for example, in the range from not less than 0.2 μm and not more than 100 μm or in the range from not less than 1 μm and not more than 30 μm.

The first intermediate supporting layer 21b has the same configuration as the organic EL layers 13, as described above.

The material and the thickness of the second intermediate supporting layer 21c are the same as those described above for the cathodes 18.

It is preferable that the upper supporting layer 21d is formed of the same material as the sealing layer 14. The thickness of the upper supporting layer 21d is not particularly limited. For example, as shown in FIG. 2, the thickness of the upper supporting layer 21d may be a value obtained by subtracting, from the thickness of the sealing layer 14, the thicknesses of the lower supporting layer 21a, the first intermediate supporting layer 21b, and the second intermediate supporting layer 21c. Alternatively, the upper supporting layer 21d may have the same thickness as the sealing layer 14, or may have any other thickness.

Next, a method for producing the organic EL device 2 of the present embodiment will be described with reference to an illustrative example. It is to be noted, however, that this production method is merely illustrative, and the organic EL device 2 of the present embodiment may be produced by any method. As in the first embodiment, the organic EL device 2 of the present embodiment preferably is produced in an inert gas atmosphere in order to reduce the possibility that the organic EL elements may be in contact with moisture.

First, a second substrate 12 is prepared in the same manner as in the first embodiment.

Next, the anode 17 is formed on the mounting surface of the first substrate 11 in the same manner as in the first embodiment.

Next, the lower supporting layer 21a is formed on the anode 17. The lower supporting layer 21a can be formed in the same manner as the anode 17 using the above-described material of the lower supporting layer 21a, for example. The lower supporting layer 21a also can be formed by applying the above-described material of the lower supporting layer 21a by dispensed coating, ink-jet coating, or printing such as screen printing, flexographic printing, or gravure printing.

When the lower supporting layer 21a is formed by photolithography, the lower supporting layer 21a can be formed by, for example, forming a photoresist film on the anode 17 and patterning the thus-formed photoresist film by photolithography. The photoresist may be either a negative photoresist or a positive photoresist. For example, the photoresist may be a negative photoresist such as an acrylic resin, novolac, or polyimide. The photolithography is preferable because it is possible to form a fine pattern of a 10-μm scale, and further, light emitted from the organic EL layers 13 is not blocked if a transparent acrylic resin is used as the photoresist.

When the lower supporting layer 21a is formed by printing, the printing process may be repeated a plurality of times until the lower supporting layer 21a has a desired thickness. When the lower supporting layer 21a is formed by printing, the cross-sectional area of the lower supporting layer 21a in the in-plane direction of the mounting surface of the first substrate 11 is larger as compared with the case where the lower supporting layer 21a is formed by photolithography. However, printing brings about the following advantages: the thickness can be increased easily; a wider choice is allowed for the material; and printing requires simple forming steps and a simple apparatus, so that the lower supporting layer 21a can be formed with high efficiency at low cost.

Next, the organic EL layers 13 and the first intermediate supporting layer 21b are formed at the same time on the anode 17 and on the lower supporting layers 21a, respectively, using the same material in the same manner as the organic EL layer 13 in the organic EL device 1 of the first embodiment. By forming the organic EL layers 13 and the first intermediate supporting layer 21b at the same time using the same material as described above, it is possible to eliminate the necessity of patterning these components or simplify the patterning of these components, so that the organic EL device 2 can be produced more easily, for example. The same applies to the cathodes 18 and the second intermediate supporting layer 21c to be described below.

Next, the cathodes 18 and the second intermediate supporting layer 21c are formed at the same time on the organic EL layers 13 and on the first intermediate supporting layer 21b, respectively, using the same material in the same manner as the cathode 18 in the organic EL device 1 of the first embodiment.

Next, the moisture absorbent 19 is disposed in each of the two recessed parts 16 on the surface of the second substrate 12 facing the first substrate 11 in the same manner as in the first embodiment.

Next, the scaling layer 14 and the upper supporting layers 21d are formed at the same time on the anode 17 and on the second intermediate supporting layer 21c, respectively, using the same material, as described above. A gap present between the first substrate 11 and the second substrate 12 and surrounded by the sealing layer 14 is filled with a filler 20. Thereafter, the second substrate 12 is bonded to the upper surfaces of the sealing layer 14 and the upper supporting layer 21d with an adhesive or by fusion. Through the above-described process, the organic EL device 2 of the present embodiment can be obtained. As in the case of the production of the organic EL device 1 of the first embodiment, when the organic EL device 2 of the present embodiment is produced in an inert gas atmosphere and the inert gas is used as the filler 20, the gap is already filled with the inert gas, so that it is not necessary to perform the above-described step of filling the gap with the filler 20.

The organic EL device 2 of the present embodiment also can exhibit the same effect as the organic EL device 1 of the first embodiment. The organic EL device 2 of the present embodiment also can be used in the same applications as the organic EL device 1 of the first embodiment.

In the organic EL device 2 of the present embodiment, the supporting layer 21 is disposed so as to connect part of the region without the EL elements on the mounting surface of the first substrate 11 and the protruding part 15 on the surface of the second substrate 12 facing the first substrate 11. With this configuration, it is possible to more effectively prevent the distance between the first substrate 11 and the second substrate 12 in the thickness direction from becoming shorter when the organic EL device 2 is bent. As a result, the possibility that the organic EL elements may be damaged when the organic EL device 2 is bent can be reduced more suitably. Moreover, according to the organic EL device 2 of the present embodiment, the two organic EL elements partitioned with the supporting layer 21 can be disposed in separately sealed regions, respectively.

The organic EL device 2 of the present embodiment has the supporting layer 21, which divides the gap present between the first substrate 11 and the second substrate 12 and surrounded by the sealing layer 14 into two gaps. Thus, in the organic EL device 2 of the present embodiment, the two separately sealed gaps are filled with the filler 20. With this configuration, the organic EL device 2 of the present embodiment can restrict the movement of the filler 20 still more effectively, whereby uneven distribution of the filler 20 can be inhibited still more effectively. Therefore, according to the organic EL device 2 of the present embodiment, it is possible to still more suitably prevent the surface of the second substrate 12 facing the first substrate 11 from coming into contact with the organic EL elements when the organic EL device 2 is bent. As a result, the possibility that the organic EL elements may be damaged can be reduced still more suitably.

Further, the organic EL device 2 of the present embodiment has the supporting layer 21 that connects part of the region without the EL elements on the mounting surface of the first substrate 11 and the protruding part 15 on the surface of the second substrate 12 facing the first substrate 11. Thus, in the organic EL device 2 of the present embodiment, the protruding part 15 cannot come into contact with the organic EL elements. Furthermore, in the organic EL device 2 of the present embodiment, even if the sealing layer 14 is made thinner, it is possible to provide an enough space to be filled with the filler 20 by increasing the depth of the recessed parts 16. Thus, according to the organic EL device 2 of the present embodiment, by making the sealing layer 14 thinner, it is possible to reduce the moisture passing through the sealing layer 14 to infiltrate into the device, whereby the deterioration of the organic EL elements can be inhibited more suitably.

Third Embodiment

Figure 3A:
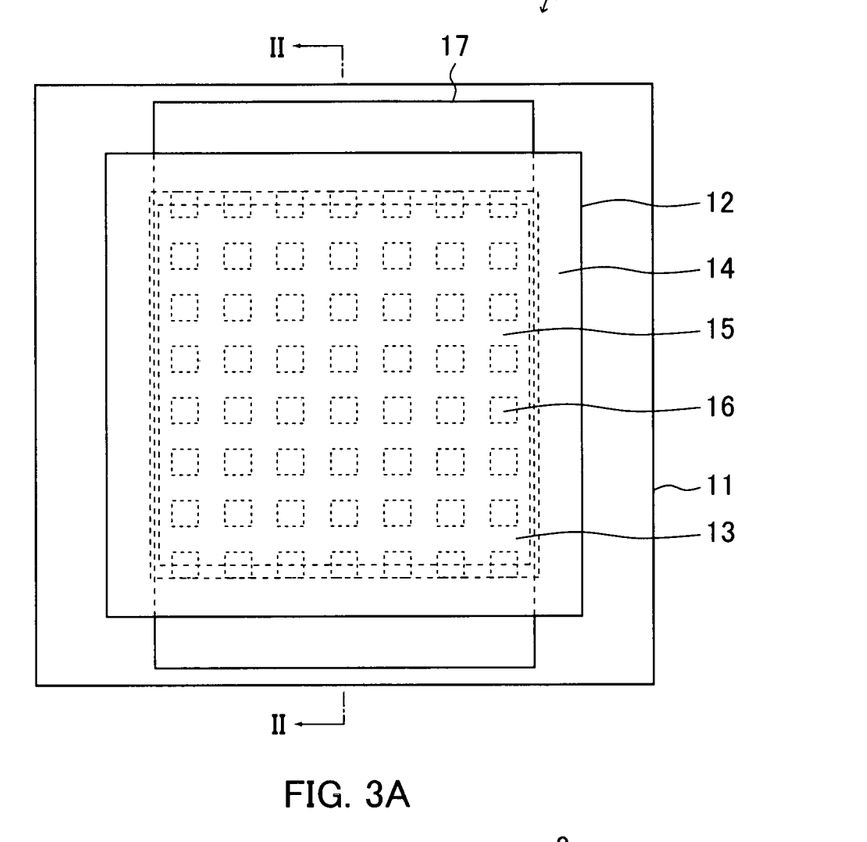
FIG. 3A is a plan view showing an example of the configuration of an organic EL device of a third embodiment.
Figure 3B:
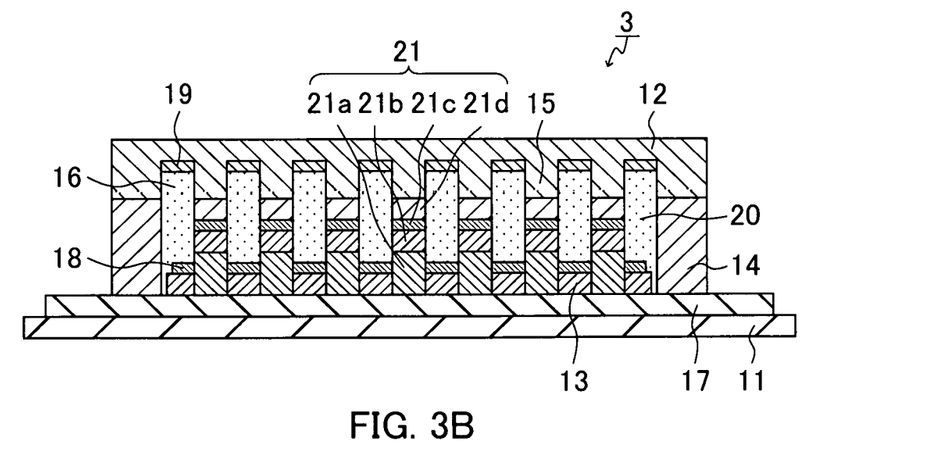
FIG. 3B is a sectional view of the organic EL device shown in FIG. 3A, taken in the arrow direction of line II-II in FIG. 3A.

The present embodiment is directed to an example of an organic EL device configured so that recessed parts 16 are formed in a grid pattern on a surface of a second substrate 12 facing a first substrate 11. FIG. 3A is a plan view showing an example of the configuration of the organic EL device of the present embodiment, and FIG. 3B is a sectional view of the organic EL device shown in FIG. 3A, taken in the arrow direction of line II-II in FIG. 3A. As shown in FIGS. 3A and 3B, the organic EL device 3 of the present embodiment has the same configuration as the organic EL device 2 of the second embodiment and can be produced in the same manner as the organic EL device 2 of the second embodiment, except that the recessed parts 16 are formed in a grid pattern. FIGS. 3A and 3B show the organic EL device 3 configured so that, similarly to the organic EL device 2 of the second embodiment, it includes a supporting layer 21 and the supporting layer 21 is disposed so as to connect part of a region without an organic EL element on a mounting surface of the first substrate 11 and a protruding part 15 on the surface of the second substrate 12 facing the first substrate 11. It is to be noted, however, that the organic EL device of the present embodiment is not limited to this illustrative example, and may be configured so that it does not include any supporting layer, similarly to the organic EL device 1 of the first embodiment shown in FIG. 1.

In the organic EL device 3 of the present embodiment, the protruding part 15 is formed so as to extend continuously between the respective pairs of adjacent recessed parts 16 on the surface of the second substrate 12 facing the first substrate 11. The distance between each pair of adjacent recessed parts 16 is in the range from 5 to 300 µm or 8 to 100 µm, for example. The length of one side of the recessed part 16 is in the range from 50 to 6000 µm or 80 to 2000 µm, for example. Further, on the mounting surface of the first substrate 11, a light emission region in the region surrounded by the sealing layer 14 is at least 80% or at least 90%, for example. The light emission region is a region provided with the organic EL element.

The organic EL device 3 of the present embodiment also can exhibit the same effect as the organic EL devices of the first and second embodiments. The organic EL device 3 of the present embodiment also can be used in the same applications as the organic EL devices of the first and second embodiments.

In the configuration of the organic EL device 3 of the present embodiment, the recessed parts 16 on the surface of the second substrate 12 facing the first substrate 11 are formed in a grid pattern and the supporting layer 21 is disposed so as to connect part of the region without the organic EL element on the mounting surface of the first substrate 11 and the protruding part 15 on the surface of the second substrate 12 facing the first substrate 11. With this configuration, the organic EL device 3 can attain both the strength and the flexibility.

Fourth Embodiment

Figure 4A:
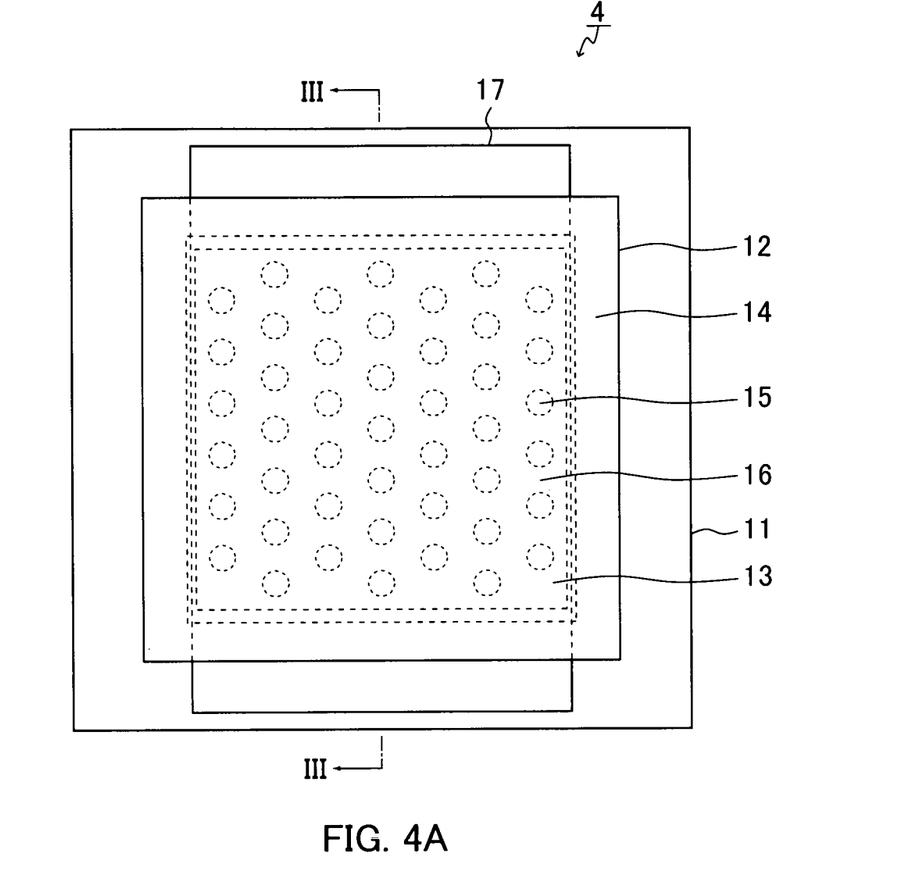
FIG. 4A is a plan view showing an example of the configuration of an organic EL device of a fourth embodiment.
Figure 4B:
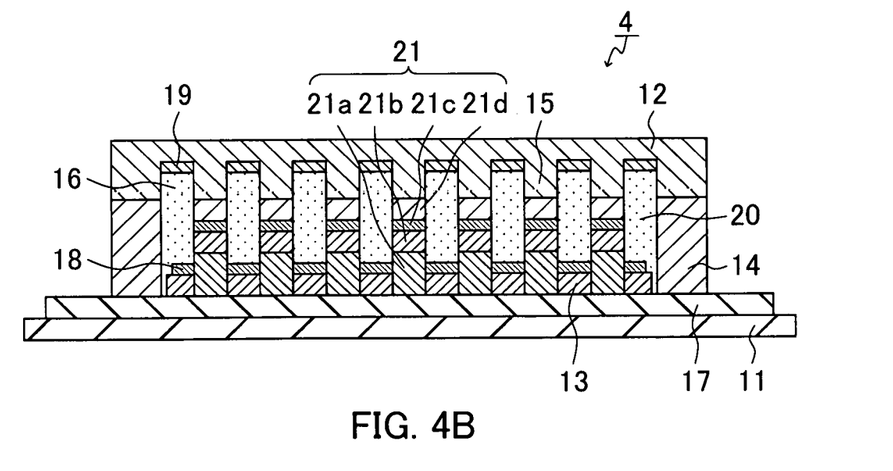
FIG. 4B is a sectional view of the organic EL device shown in FIG. 4A, taken in the arrow direction of line III-III in FIG. 4A.

The present embodiment is directed to an example of an organic EL device configured so that protruding parts 15 on a surface of a second substrate 12 facing a first substrate 11 are formed in a dot pattern. FIG. 4A is a plan view showing an example of the configuration of the organic EL device of the present embodiment, and FIG. 4B is a sectional view of the organic EL device shown in FIG. 4A, taken in the arrow direction of line III-III in FIG. 4A. As shown in FIGS. 4A and 4B, the organic EL device 4 of the present embodiment has the same configuration as the organic EL device 2 of the second embodiment and can be produced in the same manner as the organic EL device 2 of the second embodiment, except that the protruding parts 15 on the surface of the second substrate 12 facing the first substrate 11 are formed in a dot pattern. FIGS. 4A and 4B show the organic EL device 4 configured so that, similarly to the organic EL device 2 of the second embodiment, it includes supporting layers 21 and the supporting layers 21 are disposed so as to connect part of a region without an organic EL element on a mounting surface of the first substrate 11 and the protruding parts 15 on the surface of the second substrate 12 facing the first substrate 11. It is to be noted, however, that the organic EL device of the present embodiment is not limited to this illustrative example, and may be configured so that it does not include any supporting layer, similarly to the organic EL device 1 of the first embodiment shown in FIG. 1.

In the organic EL device 4 of the present embodiment, in the in-plane direction of the surface of the second substrate 12 facing the first substrate 11, the density of the protruding parts 15 in the region surrounded by the sealing layer 14 is in the range from 10 to 10000 protruding parts/cm$^2$, for example. By setting the density in the above-described range, it is possible to more suitably prevent the surface of the second substrate 12 facing the first substrate 11 from coming into contact with the organic EL element when the organic EL device 4 is bent. As a result, the possibility that the organic EL element may be damaged can be reduced more suitably. The density may be in the range from 100 to 400 protruding parts/cm². In the in-plane direction of the surface of the second substrate 12 facing the first substrate 11, the cross-sectional area per protruding part 15 is in the range from 15 to 80000 μm² or 50 to 8000 μm², for example. In the organic EL device 4 of the present embodiment, a light emission region in the region surrounded by the sealing layer 14 on the mounting surface of the first substrate 11 is the same as that in the organic EL device 3 of the third embodiment.

The organic EL device 4 of the present embodiment also can exhibit the same effect as the organic EL devices of the first to third embodiments. The organic EL device 4 of the present embodiment also can be used in the same applications as the organic EL devices of the first to third embodiments.

In the organic EL device 4 of the present embodiment, the protruding parts 15 on the surface of the second substrate 12 facing the first substrate 11 are formed in a dot pattern and the supporting layers 21 are disposed so as to connect part of the region without the organic EL element on the mounting surface of the first substrate 11 and the protruding parts 15 on the surface of the second substrate 12 facing the first substrate 11. With this configuration, in the organic EL device 4, the area of the connected parts between the first substrate 11 and the second substrate 12 is smaller than that in the organic EL device including the same number of recessed parts in a grid pattern as the protruding parts 15 in a dot pattern. Accordingly, it is possible to further improve the flexibility of the organic EL device 4 and to make the light emission region still larger.

Fifth Embodiment

In the present embodiment, the organic EL lighting panel according to the present invention will be described. The organic EL lighting panel of the present invention is characterized in that it includes the organic EL device of any of the first to fourth embodiments. Other configurations or conditions are by no means limited, and may be the same as those in conventionally known organic EL lighting panels, for example.

Sixth Embodiment

In the present embodiment, the organic EL lighting apparatus according to the present invention will be described. The organic EL lighting-apparatus of the present invention is characterized in that it includes the organic EL device of any of the first to fourth embodiments or the organic EL lighting panel of the fifth embodiment. Other configurations or conditions are by no means limited, and may be the same as those in conventionally known organic EL lighting apparatuses, for example.

Seventh Embodiment

In the present embodiment, the organic EL display according to the present invention will be described. The organic EL display of the present invention is characterized in that it includes the organic EL device of any of the first to fourth embodiments or the organic EL lighting panel of the fifth embodiment. Other configurations or conditions are by no means limited, and may be the same as those in conventionally known organic EL displays, for example.

While the present invention has been described above with reference to exemplary embodiments, the present invention is by no means limited thereto. Various changes and modifications that may become apparent to those skilled in the art may be made in the configuration and specifics of the present invention without departing from the scope of the present invention.

This application claims priority from Japanese Patent Application No. 2015-160992 filed on Aug. 18, 2015. The entire disclosure of this Japanese patent application is incorporated herein by reference.

INDUSTRIAL APPLICABILITY

According to the present invention, it is possible to provide an organic EL device that allows a wide choice for the material of a filler and also can reduce the possibility that an organic EL element(s) may be damaged when the organic EL device is bent. The organic EL device of the present invention can be used in a wide range of applications, such as an organic EL lighting panel, an organic EL lighting apparatus, and an organic EL display, for example.

EXPLANATION OF REFERENCE NUMERALS 1, 2, 3, 4, 5, 6: organic EL device
11: first substrate
12: second substrate
13: organic EL layer
14: sealing layer
15: protruding part
16: recessed part
17: anode
18: cathode
19: moisture absorbent
20: filler
21: supporting layer
22: separate member

The invention claimed is:

1. An organic electroluminescence (EL) device comprising:
 a first substrate;
 a second substrate;
 one or more organic EL elements; and
 a sealing layer,
 each of the one or more organic EL elements comprising an organic EL layer and a pair of electrodes,
 one surface of the first substrate being a mounting surface on which the one or more organic EL elements are disposed,
 the first substrate and the second substrate being laminated in such a manner that the mounting surface of the first substrate and one surface of the second substrate face each other with the sealing layer interposed therebetween,
 the sealing layer sealing a gap between the first substrate and the second substrate along an entire periphery of a region facing the second substrate on the mounting surface of the first substrate and an entire periphery of a region facing the first substrate on the surface of the second substrate facing the first substrate,
 wherein the second substrate has at least one recessed part and at least one protruding part in a region inside the sealing layer on the surface of the second substrate facing the first substrate, and the moisture absorbent is disposed in the recessed part, the organic EL device further comprising one or more supporting layers, wherein the one or more supporting layers are disposed in such a manner that the one or more supporting layers connect a whole or a part of a region, without the one or more organic EL elements on the mounting surface of the first substrate, and a flat tip surface of the protruding part on the surface of the second substrate facing the first substrate, and each of the one or more supporting layers being a laminate including an insulating layer and an organic electroluminescence layer.

2. The organic EL device according to claim 1, wherein the at least one recessed part comprises a plurality of recessed parts, and the recessed parts on the surface of the second substrate facing the first substrate are formed in a grid pattern.

3. The organic EL device according to claim 2, wherein the distance between each pair of adjacent recessed parts is in a range from 5 to 300 pm.

4. The organic EL device according to claim 2, wherein the length of one side of each recessed part is in a range from 50 to 6000 pm.

5. The organic EL device according to claim 1, wherein the at least one protruding part comprises a plurality of protruding parts, and the protruding parts on the surface of the second substrate facing the first substrate are formed in a dot pattern.

6. The organic EL device according to claim 5, wherein in an in-plane direction of the mounting surface of the surface of the second substrate facing the first substrate, the density of the protruding parts in a region surrounded by the sealing layer is in a range from 10 to 10000 protruding parts/cm$^2$.

7. The organic EL device according to claim 5, wherein in the in-plane direction of the mounting surface of the surface of the second substrate facing the first substrate, a cross-sectional area per protruding part is in a range from 15 to 80000 p$^2$.

8. The organic EL device according to claim 1, wherein in the in plane direction of the mounting surface of the first substrate, a light emission region in a region surrounded by the sealing layer is at least 80%.

9. The organic EL device according to claim 1, wherein the organic EL element is a laminate in which an electrode layer as one of the pair of electrodes, the organic EL layer, and another electrode layer as the other one of the pair of electrodes are laminated in this order in a direction in which the first substrate and the second substrate face each other.

10. The organic EL device according to claim 9, wherein in the organic EL element, the electrode layer on the first substrate side is an anode and the electrode layer on the second substrate side is a cathode.

11. The organic EL device according to claim 1, wherein the first substrate and the second substrate are flexible substrates.

12. An organic electroluminescence (EL) lighting panel comprising:

the organic EL device according to claim 1.

13. An organic electroluminescence (EL) lighting apparatus comprising:

the organic EL lighting panel according to claim 12.

14. An organic electroluminescence (EL) display comprising:

the organic EL lighting panel according to claim 12.

15. An organic electroluminescence (EL) lighting apparatus comprising:

the organic EL device according to claim 1.

16. An organic electroluminescence (EL) display comprising:

the organic EL device according to claim 1.

* * * * *